(12) United States Patent
Chang et al.

(10) Patent No.: US 12,047,075 B2
(45) Date of Patent: *Jul. 23, 2024

(54) CIRCUITS AND METHODS FOR REDUCING KICKBACK NOISE IN A COMPARATOR

(71) Applicant: Taiwan Semiconductor Manufacturing Co., Ltd., Hsin-Chu (TW)

(72) Inventors: Chin-Ho Chang, Hisinchu (TW); Jaw-Juinn Horng, Hsinchu (TW); Yung-Chow Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 48 days.

This patent is subject to a terminal disclaimer.

(21) Appl. No.: 17/837,960

(22) Filed: Jun. 10, 2022

(65) Prior Publication Data

US 2022/0302903 A1    Sep. 22, 2022

Related U.S. Application Data

(63) Continuation of application No. 17/080,317, filed on Oct. 26, 2020, now Pat. No. 11,398,811, which is a continuation of application No. 16/457,459, filed on Jun. 28, 2019, now Pat. No. 10,819,316.

(60) Provisional application No. 62/737,379, filed on Sep. 27, 2018.

(51) Int. Cl.
*H03K 3/013* (2006.01)
*H03K 3/023* (2006.01)

(52) U.S. Cl.
CPC ............. *H03K 3/013* (2013.01); *H03K 3/023* (2013.01)

(58) Field of Classification Search
CPC ........ H03K 3/013; H03K 3/023; H03K 3/037; H03K 5/22; H03K 5/2481; H03K 5/249; H03K 17/74; H03K 17/133; H03K 17/56; H03H 7/40; H03H 11/30
USPC ........................... 327/63, 64, 65, 50, 51, 52
See application file for complete search history.

(56) References Cited

U.S. PATENT DOCUMENTS

| | | |
|---|---|---|
| 6,847,234 B2 | 1/2005 | Choi |
| 7,271,623 B2 | 9/2007 | Palmer |
| 7,570,082 B2 | 8/2009 | Gebara |
| 8,120,385 B2 | 2/2012 | Singh |
| 10,637,453 B2 * | 4/2020 | Dai ....................... H03M 1/002 |
| 10,819,316 B2 | 10/2020 | Chang |

(Continued)

*Primary Examiner* — Hai L Nguyen
(74) *Attorney, Agent, or Firm* — Duane Morris LLP

(57) ABSTRACT

Circuits and methods for reducing and cancelling out kickback noise are disclosed. In one example, a circuit for a comparator is disclosed. The circuit includes: a first transistor group, a second transistor group, and a first switch. The first transistor group comprises a first transistor having a drain coupled to a first node, and a second transistor having a source coupled to the first node. Gates of the first transistor and the second transistor are coupled together to a first input of the comparator. The second transistor group comprises a third transistor having a drain coupled to a second node, and a fourth transistor having a source coupled to the second node. Gates of the third transistor and the fourth transistor are coupled together to a second input of the comparator. The first switch is connected to and between the first node and the second node.

20 Claims, 8 Drawing Sheets

(56) References Cited

U.S. PATENT DOCUMENTS

| | | |
|---|---|---|
| 2006/0132191 A1 | 6/2006 | Palmer |
| 2009/0066555 A1 | 3/2009 | Van Der Plas et al. |

\* cited by examiner

CIRCUITS AND METHODS FOR REDUCING KICKBACK NOISE IN A COMPARATOR

CROSS-REFERENCE TO RELATED APPLICATIONS

The present application is a continuation of U.S. patent application Ser. No. 17/080,317, filed on Oct. 26, 2020, now U.S. Pat. No. 11,398,811 issued on Jul. 26, 2022, which is a continuation of U.S. patent application Ser. No. 16/457,459, filed on Jun. 28, 2019, now U.S. Pat. No. 10,819,316 issued on Oct. 27, 2020, which claims priority to U.S. Provisional Patent Application No. 62/737,379, filed on Sep. 27, 2018, each of which is incorporated by reference herein in its entirety.

BACKGROUND

In many integrated circuits (IC), a transistor with a long channel length is needed to improve circuit performance, e.g. to avoid or reduce input-offset and input-referred noise of a comparator. As semiconductor process nodes and electronic components in IC are continuously scaling down (e.g. 20 nm, 16 nm and beyond), a single transistor with a long channel length is no longer available.

Stacking multiple stages of gates of transistors, e.g. metal-oxide-semiconductor (MOS) transistors with small channel length, can form an equivalent transistor with a long channel length. But internal nodes of the stack-gate structure in an existing comparator can induce unequal kickback noise that will destroy the performance of the comparator. This is because when the comparator operates at off mode, namely a pre-charge operation, internal nodes of the stack-gate are floating and can have an arbitrary voltage. When the comparator is turned on or at a latch operation, these uncontrolled internal nodes can induce unequal kickback noise, which will significantly degrade the comparator performance. For example, an analog-to-digital converter (ADC) having such a comparator will suffer from a poor signal-to-noise ratio (SNR) performance.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
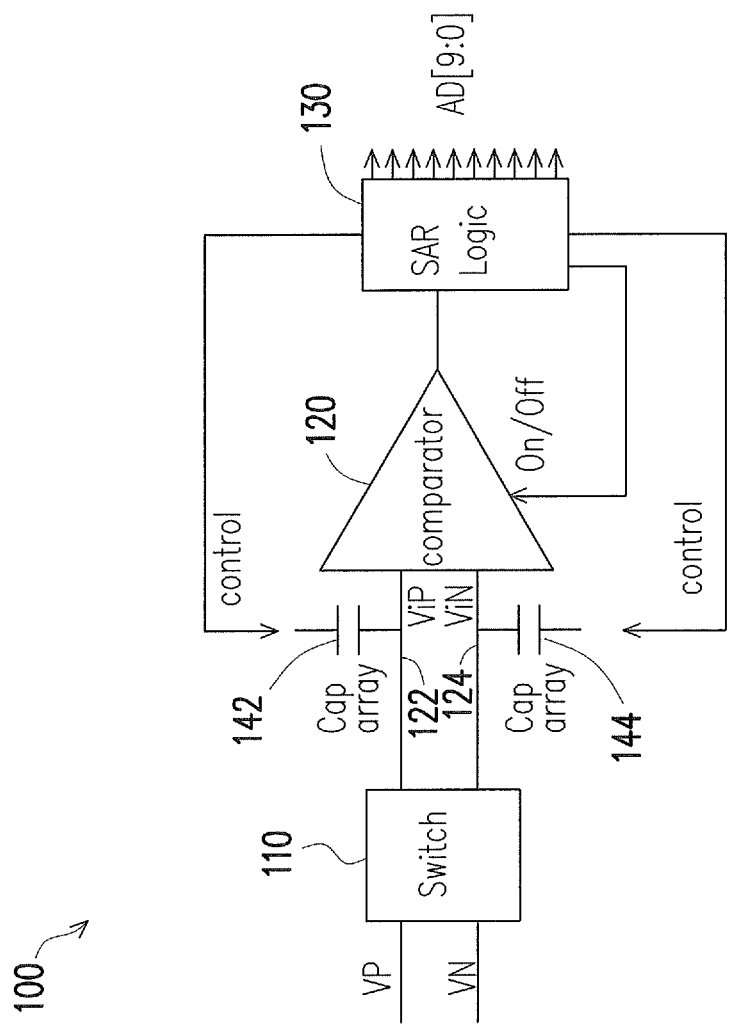
FIG. 1 illustrates a diagram of an exemplary circuit for an analog-to-digital converter (ADC), in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present teaching discloses circuits and methods for reducing and cancelling out kickback noise in a comparator. In one embodiment, a new circuit design is disclosed for canceling out kickback noise for a comparator having a stack-gate structure. With the new circuit design, when the comparator operates at an off mode, the internal nodes of a differential pair of stack-gate transistors in the comparator are connected to each other or tied to a power-supply pin (e.g. VDD). In this manner, the kickback noise from the internal nodes will be equal when the comparator is turned on, such that the differential operation of the comparator can cancel out the equal kickback noise easily.

There are at least two stages of the stack-gate structure in a disclosed comparator. In one embodiment, there are three or more stages in a stack-gate transistor. That is, each transistor with along channel length in the differential pair of the comparator is formed by cascading three or more transistors with short channel length. As such, two or more pairs of internal nodes may generate kickback noise. In this case, switches are added to the comparator to ensure that kickback noises generated by each pair of internal nodes will be equal to each other when the comparator is turned on, such that the differential operation of the comparator can reduce or cancel out the equal kickback noise easily.

FIG. 1 illustrates a diagram of an exemplary circuit 100 for an analog-to-digital converter (ADC), in accordance with some embodiments of the present disclosure. The exemplary circuit 100 is utilized as part of a successive approximation register (SAR) ADC, which is shown as one example of using a comparator that compares two voltages or currents and outputs a signal indicating which is larger. As shown in FIG. 1, the exemplary circuit 100 includes a switch 110, a comparator 120 and a SAR logic 130. The comparator 120 in this example receives two input voltages ViP 122 and ViN 124 from the switch 110, compares the two voltages ViP 122 and ViN 124, and outputs the comparison result as a signal to the SAR logic 130. The SAR logic 130 generates an approximate digital code to convert the input analog signal to a digital signal. The SAR logic 130 can control the comparator 120 to be turned on or off. In addition, there are two capacitor arrays 142, 144 coupled to the two inputs of the comparator 120, respectively. Each of the capacitor arrays 142, 144 may be controlled by the SAR logic 130 as well. The signal to noise-plus-distortion ratio (SNDR) performance of the circuit 100 depends heavily on the performance of the comparator 120. While the circuit 100 is shown as an example, a comparator's performance is critical to many other kinds of circuits including the comparator as well.

Figure 2B:
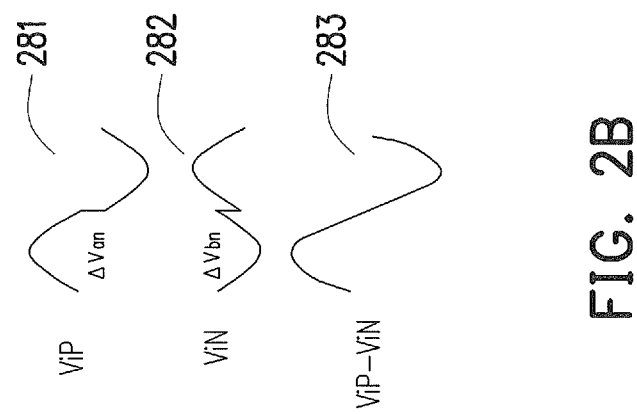
FIGS. 2A and 2B illustrate an exemplary circuit of a comparator for reducing kickback noise, in accordance with some embodiments of the present disclosure.
Figure 2A:
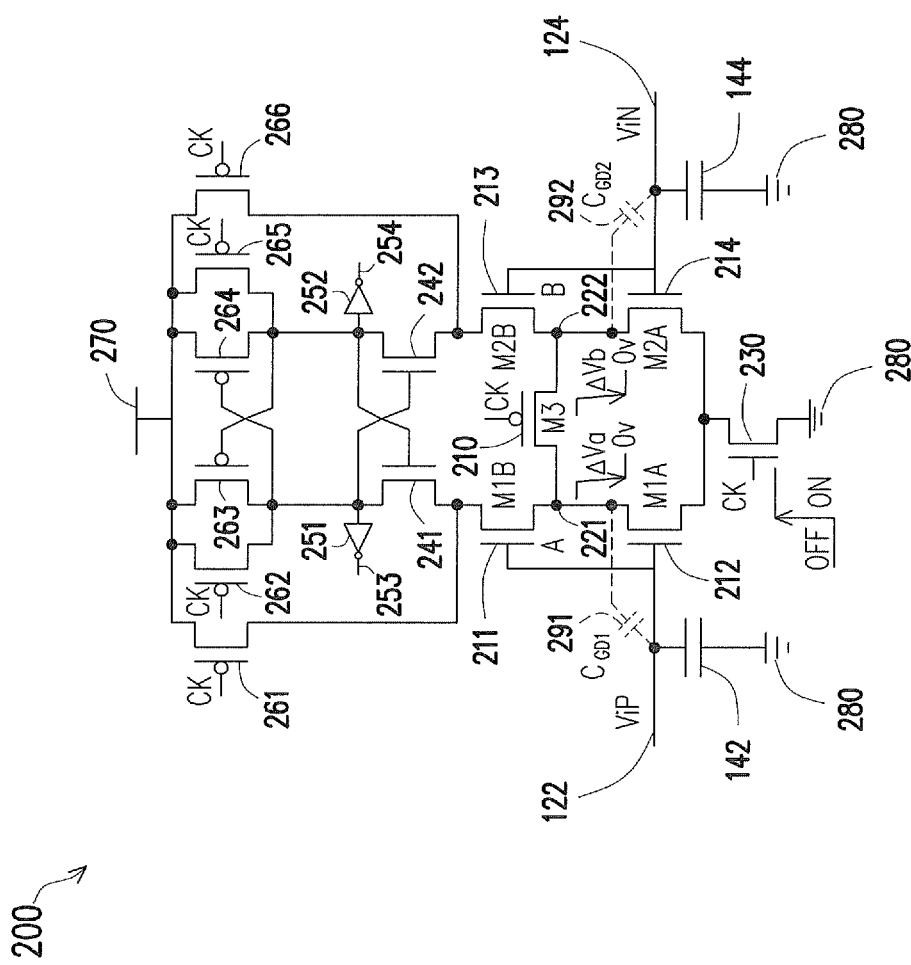

FIGS. 2A and 2B illustrate an exemplary circuit 200 of a comparator for reducing kickback noise, in accordance with some embodiments of the present disclosure. As shown in FIG. 2A, the exemplary circuit 200 includes a differential pair of transistor groups: a first transistor group comprising the transistor M1B 211 and the transistor M1A 212, and a second transistor group comprising the transistor M2B 213 and the transistor M2A 214.

The transistor 211 has a drain coupled to a node A 221, while the transistor 212 has a source coupled to the node A 221. In addition, gates of the transistor 211 and the transistor 212 are coupled together to a first input 122 of the comparator 200. As such, the transistor M1B 211 and the transistor M1A 212 are cascaded to form an equivalent transistor with a longer gate length that is equal to a sum of the gate lengths of the transistor M1B 211 and the transistor M1A 212. That is, the transistor 211, responsive to a first differential signal ViP from the first input 122, is configured for conducting current to the node A 221; and the transistor 212, responsive to the first differential signal, is configured for conducting current from the node A 221.

The transistor 213 has a drain coupled to a node B 222, while the transistor 214 has a source coupled to the node B 222. In addition, gates of the transistor 213 and the transistor 214 are coupled together to a second input 124 of the comparator 200. As such, the transistor M2B 213 and the transistor M2A 214 are cascaded to form an equivalent transistor with a longer gate length that is equal to a sum of the gate lengths of the transistor M2B 213 and the transistor M2A 214. That is, the transistor 213, responsive to a second differential signal ViN from the second input 124, is configured for conducting current to the node B 222; and the transistor 214, responsive to the second differential signal, is configured for conducting current from the node B 222.

In this embodiment, drains of the transistor 212 and the transistor 214 are coupled together and coupled to a control transistor 230. The control transistor 230 in this example is configured to turn on or off the comparator 200 by a control signal. Specifically, the control transistor 230 includes: a source coupled to the drains of the transistor 212 and the transistor 214, a drain coupled to a ground 280, and a gate coupled to receive a control signal CK, which may be a control signal received from a SAR logic 130 as shown in FIG. 1. In response to a control signal turning on the gate of the control transistor 230, the control transistor 230 is configured for conducting current to the ground 280 from the drains of the transistor 212 and the transistor 214.

In this embodiment, the node A 221 is coupled to the first input 122 through a first parasitic capacitor 291, and the node B 222 is coupled to the second input 124 through a second parasitic capacitor 292. In one embodiment, the first parasitic capacitor 291 is generated at least due to the capacitor array 142 coupled between the first input 122 and the ground 280; while the second parasitic capacitor 292 is generated at least due to the capacitor array 144 coupled between the second input 124 and the ground 280.

The comparator 200 in this example further comprises a latch coupled to sources of the transistor 211 and the transistor 213. As shown in FIG. 2A, the latch comprises: a pair of transistors 241, 242; and a pair of inverters 251, 252. On one hand, the transistor 241 has a source coupled to an input of the inverter 251, and a gate coupled to an input of the inverter 252. On the other hand, the transistor 242 has a source coupled to the input of the inverter 252, and a gate coupled to the input of the inverter 251. The outputs of the inverters 251, 252 are coupled to or counted as differential outputs 253, 254 of the comparator 200.

In addition, the comparator 200 in this example further comprises: a transistor 261 coupled between a power supply 270 (e.g. VDD) and the source of the transistor 211; and a transistor 266 coupled between the power supply 270 and the source of the transistor 213. Gates of the transistor 261 and the transistor 266 are coupled to an inverse of the control signal CK.

The comparator 200 in this example further comprises: a transistor 262 coupled between the power supply 270 and the input of the inverter 251; and a transistor 265 coupled between the power supply 270 and the input of the inverter 252. Gates of the transistor 262 and the transistor 265 are coupled to an inverse of the control signal CK.

The comparator 200 in this example further comprises a pair of transistors 263, 264. The transistor 263 has: a source coupled to the power supply 270, a drain coupled to the input of the inverter 251, and a gate coupled to the input of the inverter 252. The transistor 264 has: a source coupled to the power supply 270, a drain coupled to the input of the inverter 252, and a gate coupled to the input of the inverter 251.

Importantly, the comparator 200 comprises a switch M3 210 that is connected to both the node A 221 and the node B 222. In this embodiment, the switch M3 210 comprises a transistor coupled between the node A 221 and the node B 222. According to various embodiments, the transistor 210 may be: a p-type metal-oxide-semiconductor (PMOS) transistor, an n-type metal-oxide-semiconductor (NMOS) transistor, or a complementary metal-oxide-semiconductor (CMOS) transistor. In one example, the transistor 210 has a source coupled to the node 221, and a drain coupled to the node 222. In another example, the transistor 210 has a drain coupled to the node 221, and a source coupled to the node 222. In either example, the transistor 210 has a gate coupled to an inverse of the control signal CK.

The control signal CK can control the comparator 200 to be turned on or off. For example, when the control signal CK has a voltage at a logic low level, it turns off the comparator 200; when the control signal CK has a voltage at a logic high level, it turns on the comparator 200. To be specific, when the control signal CK has a voltage at a logic low level, an inverse of the control signal CK has a voltage at a logic high level. As such, the transistor 262 and the transistor 265 are turned on, such that inputs of the inverters 251, 252 are electrically connected to the power supply 270. As such, outputs of the inverters 251, 252 and outputs of the comparator 200 merely depend on the power supply 270 and are both at logic low levels, regardless of the difference between the two input voltages ViP 122 and ViN 124. That is, the comparator 200 operates at an off mode. When the control signal CK has a voltage at a logic high level, an inverse of the control signal CK has a voltage at a logic low level. As such, the transistors 261, 262, 265, 266 are all turned off, such that outputs of the inverters 251, 252 and outputs of the comparator 200 will depend on a comparison between the two input voltages ViP 122 and ViN 124. That is, the comparator 200 operates at an on mode.

As shown in FIG. 2A, when the comparator 200 operates at an off mode and the control signal CK has a voltage at a logic low level, the control transistor 230 is turned off, such that the drains of the transistor 212 and the transistor 214 are electrically disconnected from the ground 280. In addition, because an inverse of the control signal CK has a voltage at a logic high level, the transistor 261 and the transistor 266 are turned on, such that sources of the transistor 211 and the transistor 213 are electrically connected to the power supply 270. In this case, if there was no switch M3 210 in the comparator 200, each of the internal node A 221 and the internal node B 222 would be floating and could have an arbitrary voltage. This may be because: although the transistor 211, the transistor 212, the transistor 213, and the transistor 214 may be designed to follow a same spec (all of them are the same) or a symmetric spec (the transistor 211 is the same as the transistor 213, and the transistor 212 is the same as the transistor 214), a process mismatch is unavoidable and uncontrollable for these transistors in various implementations of comparators. In addition, an asymmetric layout of the components in the comparator 200 may also cause the internal node A 221 and the internal node B 222 to be floating with an arbitrary voltage. As such, if there was no switch M3 210, the voltages of the internal node A 221 and the internal node B 222 cannot be controlled to be the same when the comparator 200 operates at an off mode.

With the switch M3 210 coupled between the internal node A 221 and the internal node B 222 as shown in FIG. 2A, when the comparator 200 operates at an off mode and the control signal CK has a voltage at a logic low level, an inverse of the control signal CK has a voltage at a logic high level to turn on the switch M3 210. As such, the internal node A 221 and the internal node B 222 are electrically connected to each other and have a same voltage when the comparator 200 operates at an off mode.

On the other hand, when the comparator 200 operates at an on mode and the control signal CK has a voltage at a logic high level, the control transistor 230 is turned on, such that the drains of the transistor 212 and the transistor 214 are electrically connected to the ground 280. In addition, because an inverse of the control signal CK has a voltage at a logic low level, the switch M3 210 is turned off. As such, the added switch M3 210 in this example does not impact the comparator 200 when the comparator 200 operates at an on mode. In this case, when the comparator 200 operates at an on mode, voltages of both the internal node A 221 and the internal node B 222 are pulled down to zero or ground voltage.

Because the internal node A 221 is coupled to the first input 122 through the first parasitic capacitor 291, it induces a kickback voltage noise to the first input voltage ViP. The kickback voltage added to the ViP may be a first function of a voltage drop of the internal node A 221 when the comparator 200 is turned on. For example, assuming the internal node A 221 has a voltage Va when the comparator 200 operates at the off mode, when the comparator 200 is turned on, the voltage is dropped to zero with a voltage drop $\Delta Va$. The kickback voltage added to the ViP is represented as $\Delta Van$ that is equal to a first function of the voltage drop $\Delta Va$. As shown in FIG. 2B, the ViP waveform 281 has a drop of $\Delta Van$ due to the kickback noise from the node 221 when the comparator 200 is turned on.

Similarly, because the internal node B 222 is coupled to the second input 124 through the second parasitic capacitor 292, it induces a kickback voltage noise to the second voltage ViN. The kickback voltage added to the ViN may be a second function of a voltage drop of the internal node B 222 when the comparator 200 is turned on. For example, assuming the internal node B 222 has a voltage Vb when the comparator 200 operates at the off mode, when the comparator 200 is turned on, the voltage is dropped to zero with a voltage drop $\Delta Vb$. The kickback voltage added to the ViN is represented as $\Delta Vbn$ that is equal to a second function of the voltage drop $\Delta Vb$. As shown in FIG. 2B, the ViN waveform 282 has a drop of $\Delta Vbn$ due to the kickback noise from the node 222 when the comparator 200 is turned on.

In this embodiment, both the first function and the second function are a same monotonic function F1, such that: $\Delta Van=F1(\Delta Va)=F1(Va-0)$, and $\Delta Vbn=F1(\Delta Vb)=F1(Vb-0)$. As discussed above, the node 221 and the node 222 are electrically connected due to the turned-on switch 210 when the comparator 200 operates at the off mode. As such, Va=Vb, such that $\Delta Van=\Delta Vbn$. That is, when the comparator 200 is turned on, the two differential inputs ViP and ViN are impacted by an equal kickback noise and dropped by a same amount of voltage ($\Delta Van=\Delta Vbn$). As such, a differential operation (ViP−ViN) of the comparator 200 can cancel out the equal kickback noise. As shown in FIG. 2B, the (ViP−ViN) waveform 283 has a good sinusoid wave with the cancelled out kickback noise. In general, even if there is some leftover kickback noise on the (ViP−ViN) waveform 283, e.g. due to different parasitic capacitances of the first parasitic capacitor 291 and the second parasitic capacitor 292 causing a difference between the first function and the second function, the kickback noise is much reduced compared to an existing comparator with floating and arbitrary Va and Vb. In one example, the comparator 200 in an ADC can improve the SNR of the ADC by about 5 dB based on HSPICE simulation, compared to an existing comparator without the transistor 210.

Figure 3B:
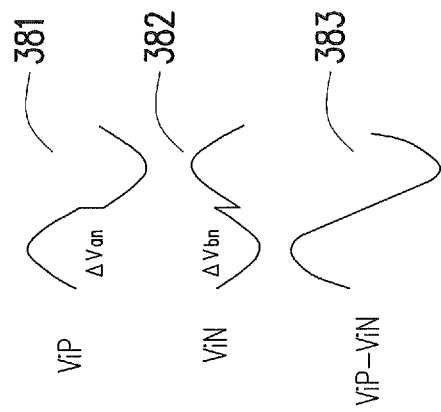
FIGS. 3A and 3B illustrate another exemplary circuit of a comparator for reducing kickback noise, in accordance with some embodiments of the present disclosure.
Figure 3A:
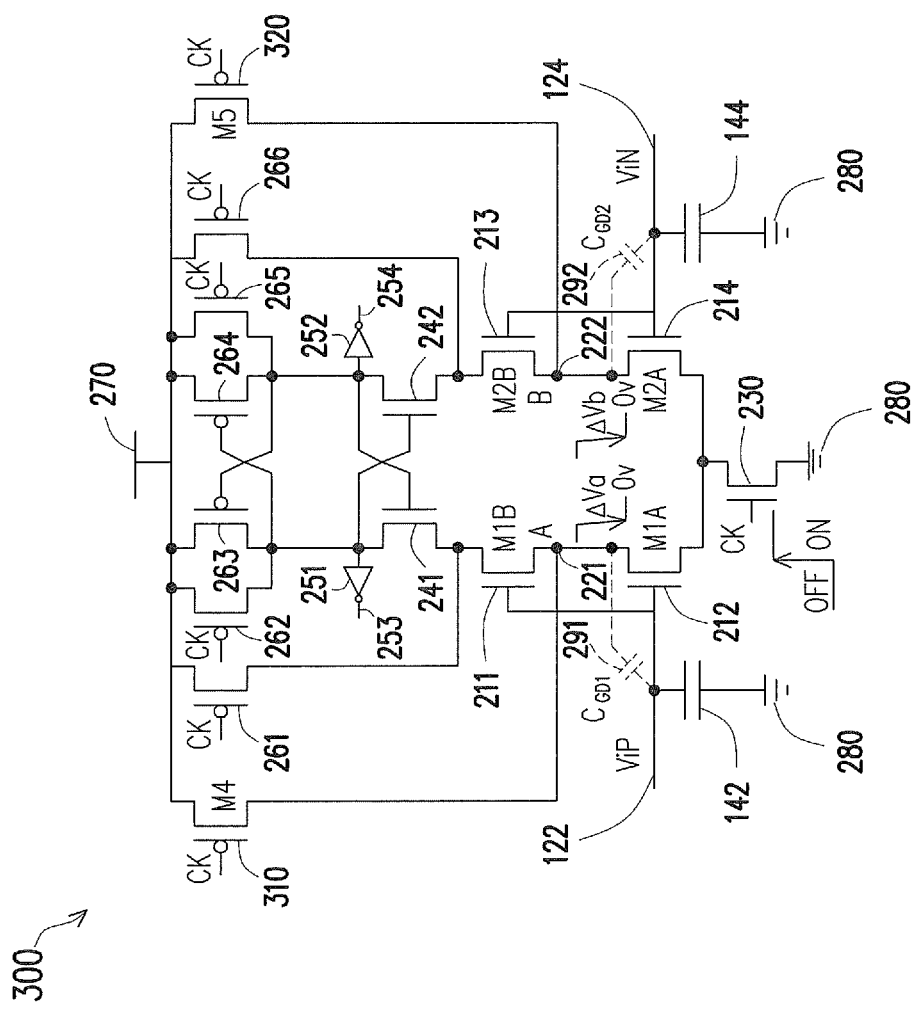

FIGS. 3A and 3B illustrate another exemplary circuit 300 of a comparator for reducing kickback noise, in accordance with some embodiments of the present disclosure. The comparator 300 in this example is similar to the comparator 200 in FIG. 2A. But instead of having the transistor 210 as shown in FIG. 2A, the comparator 300 in FIG. 3A comprises: a switch M4 310 connected between the node 221 and the power supply 270, and a switch M5 320 connected between the node 222 and the power supply 270. The switch 310, when turned on, directly couples the node 221 to the power supply 270. The switch 320, when turned on, directly couples the node 222 to the power supply 270.

In one embodiment, each of the switch 310 and the switch 320 comprises a transistor which may be: a p-type metal-oxide-semiconductor (PMOS) transistor, an n-type metal-oxide-semiconductor (NMOS) transistor, or a complementary metal-oxide-semiconductor (CMOS) transistor. In one example, the transistor 310 has a source coupled to the power supply 270 and a drain coupled to the node 221; the transistor 320 has a source coupled to the power supply 270 and a drain coupled to the node 222. Gates of the transistor 310 and the transistor 320 are coupled to an inverse of the control signal CK.

The control signal CK can control the comparator 300 to be turned on and off by having a logic high voltage and a logic low voltage, respectively. As shown in FIG. 3A, when the comparator 300 operates at an off mode and the control signal CK has a voltage at a logic low level, the control transistor 230 is turned off, such that the drains of the transistor 212 and the transistor 214 are electrically disconnected from the ground 280. In addition, because an inverse of the control signal CK has a voltage at a logic high level, the transistor 261 and the transistor 266 are turned on, such that sources of the transistor 211 and the transistor 213 are electrically connected to the power supply 270. In this case, without the transistor 310 and the transistor 320 in the comparator 300, each of the internal node A 221 and the internal node B 222 would be floating and could have an arbitrary voltage, e.g. due to an unavoidable process mismatch or an asymmetric layout of the components in the comparator 300. As such, without the transistor 310 and the transistor 320 in the comparator 300, the voltages of the internal node A 221 and the internal node B 222 cannot be controlled to be the same when the comparator 300 operates at an off mode.

With the transistor 310 coupled between the internal node A 221 and the power supply 270 as shown in FIG. 3A, when the comparator 300 operates at an off mode and the control signal CK has a voltage at a logic low level, an inverse of the control signal CK has a voltage at a logic high level to turn on the transistor 310. As such, the internal node A 221 is electrically connected to the power supply 270 to have a voltage Va=VDD when the comparator 300 operates at the off mode.

Similarly, with the transistor 320 coupled between the internal node B 222 and the power supply 270 as shown in FIG. 3A, when the comparator 300 operates at an off mode and the control signal CK has a voltage at a logic low level, an inverse of the control signal CK has a voltage at a logic high level to turn on the transistor 320. As such, the internal node B 222 is electrically connected to the power supply 270 to have a voltage Vb=VDD when the comparator 300 operates at the off mode.

On the other hand, when the comparator 300 operates at an on mode and the control signal CK has a voltage at a logic high level, the control transistor 230 is turned on, such that the drains of the transistor 212 and the transistor 214 are electrically connected to the ground 280. In addition, because an inverse of the control signal CK has a voltage at a logic low level, the transistor 310 and the transistor 320 are turned off. In this case, when the comparator 300 operates at an on mode, voltages of both the internal node A 221 and the internal node B 222 are pulled down from the voltage VDD to zero or ground voltage. That is, the voltage drops of the internal node A 221 and the internal node B 222 are the same when the comparator 300 is turned on, i.e. $\Delta Va = \Delta Vb = VDD - 0 = VDD$.

Because the internal node A 221 is coupled to the first input 122 through the first parasitic capacitor 291, it induces a kickback voltage noise to the first input voltage ViP, based on a first function of a voltage drop of the internal node A 221 when the comparator 300 is turned on. The kickback voltage added to the ViP is represented as $\Delta Van$ that is equal to a first function of the voltage drop $\Delta Va$. As shown in FIG. 3B, the ViP waveform 381 has a drop of $\Delta Van$ due to the kickback noise from the node 221 when the comparator 300 is turned on. Similarly, because the internal node B 222 is coupled to the second input 124 through the second parasitic capacitor 292, it induces a kickback voltage noise to the second voltage ViN, based on a second function of a voltage drop of the internal node B 222 when the comparator 300 is turned on. The kickback voltage added to the ViN is represented as $\Delta Vbn$ that is equal to a second function of the voltage drop $\Delta Vb$. As shown in FIG. 3B, the ViN waveform 382 has a drop of $\Delta Vbn$ due to the kickback noise from the node 222 when the comparator 300 is turned on.

In one embodiment, both the first function and the second function are a same monotonic function F2, such that: $\Delta Van = F2(\Delta Va) = F2(Va-0)$, and $\Delta Vbn = F2(\Delta Vb) = F2(Vb-0)$. As discussed above, both the node 221 and the node 222 are electrically connected to the power supply 270 due to the turned-on switches 310, 320, respectively, when the comparator 300 operates at the off mode. As such, Va=Vb=VDD, such that $\Delta Van = \Delta Vbn$. That is, when the comparator 300 is turned on, the two differential inputs ViP and ViN are impacted by an equal kickback noise and dropped by a same amount of voltage ($\Delta Van = \Delta Vbn$). As such, a differential operation (ViP−ViN) of the comparator 300 can cancel out the equal kickback noise. As shown in FIG. 3B, the (ViP−ViN) waveform 383 has a good sinusoid wave with the cancelled out kickback noise. In general, even if there is some leftover kickback noise on the (ViP−ViN) waveform 383, the kickback noise is much reduced compared to an existing comparator with floating and arbitrary Va and Vb. In one example, the comparator 300 in an ADC can improve the SNR of the ADC by about 5 dB based on HSPICE simulation, compared to an existing comparator without the transistor 310 and the transistor 320.

Figure 4:
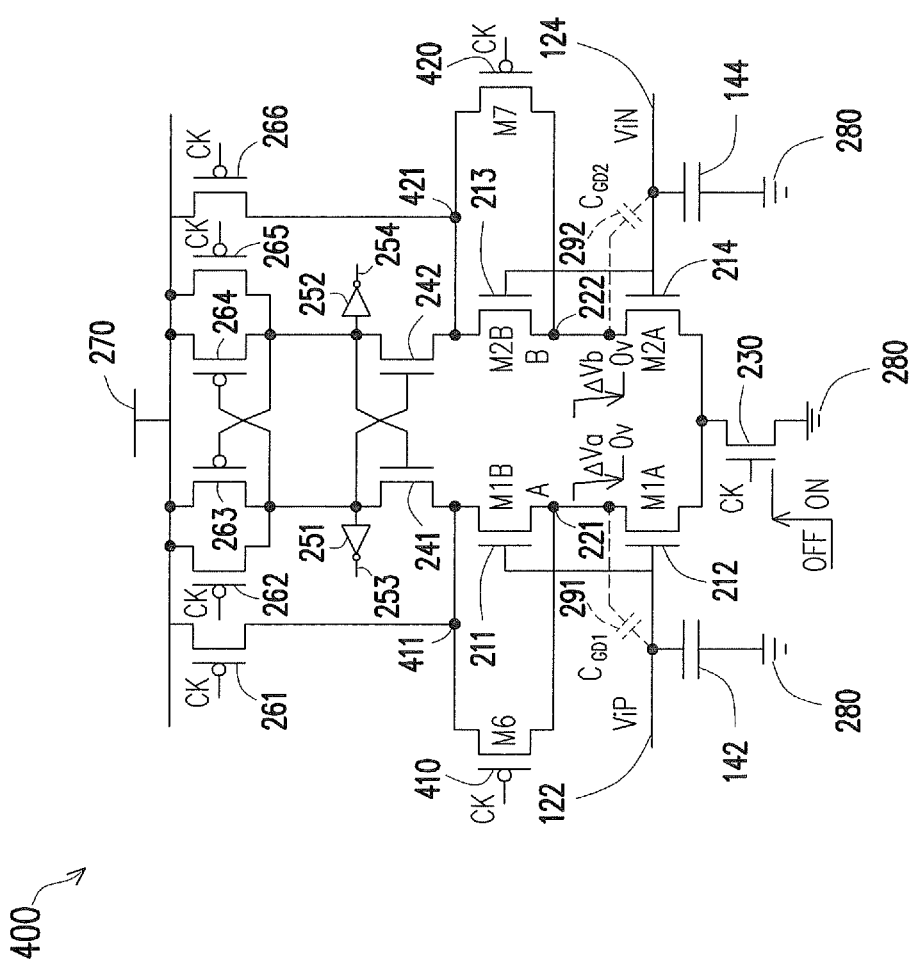
FIG. 4 illustrates yet another exemplary circuit of a comparator for reducing kickback noise, in accordance with some embodiments of the present disclosure.

FIG. 4 illustrates yet another exemplary circuit 400 of a comparator for reducing kickback noise, in accordance with some embodiments of the present disclosure. The comparator 400 in this example is similar to the comparator 300 in FIG. 3A. But instead of having the transistor 310 and the transistor 320 as shown in FIG. 3A, the comparator 400 in FIG. 4 comprises: a switch M6 410 connected between the node 221 and another internal node 411, and a switch M7 420 connected between the node 222 and another internal node 421. As shown in FIG. 4, the internal node 411 is coupled between the drain of the transistor 261 and the source of the transistor 211; the internal node 421 is coupled between the drain of the transistor 266 and the source of the transistor 213.

In one embodiment, each of the switch 410 and the switch 420 comprises a transistor which may be: a p-type metaloxide-semiconductor (PMOS) transistor, an n-type metal-oxide-semiconductor (NMOS) transistor, or a complementary metal-oxide-semiconductor (CMOS) transistor. In one example, the transistor 410 has a source coupled to the node 411 and a drain coupled to the node 221; the transistor 420 has a source coupled to the node 421 and a drain coupled to the node 222. Gates of the transistor 410 and the transistor 420 are coupled to an inverse of the control signal CK.

The control signal CK can control the comparator 400 to be turned on and off by having a logic high voltage and a logic low voltage, respectively. As shown in FIG. 4, when the comparator 400 operates at an off mode and the control signal CK has a voltage at a logic low level, the control transistor 230 is turned off, such that the drains of the transistor 212 and the transistor 214 are electrically disconnected from the ground 280. In addition, because an inverse of the control signal CK has a voltage at a logic high level, the transistor 261 and the transistor 266 are turned on, such that sources of the transistor 211 and the transistor 213 are electrically connected to the power supply 270. In this case, without the transistor 410 and the transistor 420 in the comparator 400, each of the internal node A 221 and the internal node B 222 would be floating and could have an arbitrary voltage, e.g. due to an unavoidable process mismatch or an asymmetric layout of the components in the comparator 400. As such, without the transistor 410 and the transistor 420 in the comparator 400, the voltages of the internal node A 221 and the internal node B 222 cannot be controlled to be the same when the comparator 400 operates at an off mode.

With the transistor 410 coupled between the internal node A 221 and the node 411 as shown in FIG. 4, when the comparator 400 operates at an off mode and the control signal CK has a voltage at a logic low level, an inverse of the control signal CK has a voltage at a logic high level to turn on the transistor 410 and the transistor 261. As such, the internal node A 221 is electrically connected to the power supply 270 through the node 411 to have a voltage Va=VDD when the comparator 400 operates at the off mode.

Similarly, with the transistor 420 coupled between the internal node B 222 and the node 421 as shown in FIG. 4, when the comparator 400 operates at an off mode and the control signal CK has a voltage at a logic low level, an inverse of the control signal CK has a voltage at a logic high level to turn on the transistor 420 and the transistor 266. As such, the internal node B 222 is electrically connected to the power supply 270 through the node 421 to have a voltage Vb=VDD when the comparator 400 operates at the off mode.

On the other hand, when the comparator 400 operates at an on mode and the control signal CK has a voltage at a logic high level, the control transistor 230 is turned on, such that the drains of the transistor 212 and the transistor 214 are electrically connected to the ground 280. In addition, because an inverse of the control signal CK has a voltage at a logic low level, the transistor 410, the transistor 420, the transistor 261 and the transistor 266 are turned off. In this case, when the comparator 400 operates at an on mode, voltages of both the internal node A 221 and the internal node B 222 are pulled down from the voltage VDD to zero or ground voltage. That is, the voltage drops of the internal node A 221 and the internal node B 222 are the same when the comparator 400 is turned on, i.e. $\Delta Va=\Delta Vb=VDD-0=VDD$.

Because the internal node A 221 is coupled to the first input 122 through the first parasitic capacitor 291, it induces a kickback voltage noise to the first input voltage ViP, based on a first function of a voltage drop of the internal node A 221 when the comparator 400 is turned on. The kickback voltage added to the ViP is represented as $\Delta Van$ that is equal to a first function of the voltage drop $\Delta Va$. Similarly, because the internal node B 222 is coupled to the second input 124 through the second parasitic capacitor 292, it induces a kickback voltage noise to the second voltage ViN, based on a second function of a voltage drop of the internal node B 222 when the comparator 400 is turned on. The kickback voltage added to the ViN is represented as $\Delta Vbn$ that is equal to a second function of the voltage drop $\Delta Vb$. In one embodiment, both the first function and the second function are a same monotonic function F3, such that: $\Delta Van=F3(\Delta Va)=F3(VDD)$, and $\Delta Vbn=F3(\Delta Vb)=F3(VDD)$. As such, $\Delta Van=\Delta Vbn$. That is, when the comparator 400 is turned on, the two differential inputs ViP and ViN are impacted by an equal kickback noise and dropped by a same amount of voltage ($\Delta Van=\Delta Vbn=F3(VDD)$). As such, a differential operation (ViP−ViN) of the comparator 400 can reduce or cancel out the equal kickback noise. In one example, the comparator 400 in an ADC can improve the SNR of the ADC by about 5 dB based on HSPICE simulation, compared to an existing comparator without the transistor 410 and the transistor 420.

Figure 5:
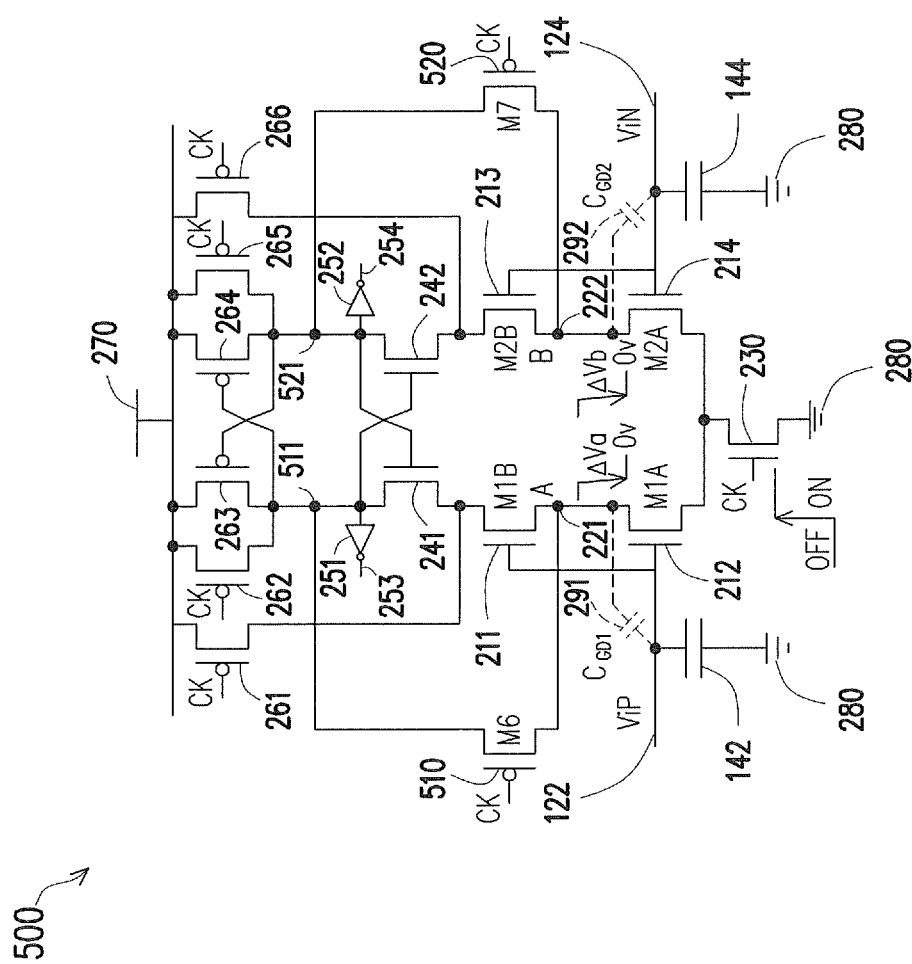
FIG. 5 illustrates still another exemplary circuit of a comparator for reducing kickback noise, in accordance with some embodiments of the present disclosure.

FIG. 5 illustrates still another exemplary circuit 500 of a comparator for reducing kickback noise, in accordance with some embodiments of the present disclosure. The comparator 500 in this example is similar to the comparator 400 in FIG. 4. But instead of having the transistor 410 and the transistor 420 as shown in FIG. 4, the comparator 500 in FIG. 5 comprises: a switch M6 510 connected between the node 221 and another internal node 511, and a switch M7 520 connected between the node 222 and another internal node 521. As shown in FIG. 5, the internal node 511 is coupled between the drain of the transistor 262 and the input of the inverter 251; the internal node 521 is coupled between the drain of the transistor 265 and the input of the inverter 252.

In one embodiment, each of the switch 510 and the switch 520 comprises a transistor which may be: a p-type metal-oxide-semiconductor (PMOS) transistor, an n-type metal-oxide-semiconductor (NMOS) transistor, or a complementary metal-oxide-semiconductor (CMOS) transistor. In one example, the transistor 510 has a source coupled to the node 511 and a drain coupled to the node 221; the transistor 520 has a source coupled to the node 521 and a drain coupled to the node 222. Gates of the transistor 510 and the transistor 520 are coupled to an inverse of the control signal CK.

The control signal CK can control the comparator 500 to be turned on and off by having a logic high voltage and a logic low voltage, respectively. As shown in FIG. 5, when the comparator 500 operates at an off mode and the control signal CK has a voltage at a logic low level, the control transistor 230 is turned off, such that the drains of the transistor 212 and the transistor 214 are electrically disconnected from the ground 280. In addition, because an inverse of the control signal CK has a voltage at a logic high level, the transistor 261 and the transistor 266 are turned on, such that sources of the transistor 211 and the transistor 213 are electrically connected to the power supply 270. In this case, without the transistor 510 and the transistor 520 in the comparator 500, each of the internal node A 221 and the internal node B 222 would be floating and could have an arbitrary voltage, e.g. due to an unavoidable process mismatch or an asymmetric layout of the components in the comparator 500. As such, without the transistor 510 and the transistor 520 in the comparator 500, the voltages of the internal node A 221 and the internal node B 222 cannot be controlled to be the same when the comparator 500 operates at an off mode.

With the transistor 510 coupled between the internal node A 221 and the node 511 as shown in FIG. 5, when the comparator 500 operates at an off mode and the control signal CK has a voltage at a logic low level, an inverse of the control signal CK has a voltage at a logic high level to turn on the transistor 510 and the transistor 262. As such, the internal node A 221 is electrically connected to the power supply 270 through the node 511 to have a voltage Va=VDD when the comparator 500 operates at the off mode.

Similarly, with the transistor 520 coupled between the internal node B 222 and the node 521 as shown in FIG. 5, when the comparator 500 operates at an off mode and the control signal CK has a voltage at a logic low level, an inverse of the control signal CK has a voltage at a logic high level to turn on the transistor 520 and the transistor 265. As such, the internal node B 222 is electrically connected to the power supply 270 through the node 521 to have a voltage Vb=VDD when the comparator 500 operates at the off mode.

On the other hand, when the comparator 500 operates at an on mode and the control signal CK has a voltage at a logic high level, the control transistor 230 is turned on, such that the drains of the transistor 212 and the transistor 214 are electrically connected to the ground 280. In addition, because an inverse of the control signal CK has a voltage at a logic low level, the transistor 510, the transistor 520, the transistor 262 and the transistor 265 are turned off. In this case, when the comparator 500 operates at an on mode, voltages of both the internal node A 221 and the internal node B 222 are pulled down from the voltage VDD to zero or ground voltage. That is, the voltage drops of the internal node A 221 and the internal node B 222 are the same when the comparator 500 is turned on, i.e. $\Delta Va=\Delta Vb=VDD-0=VDD$.

Because the internal node A 221 is coupled to the first input 122 through the first parasitic capacitor 291, it induces a kickback voltage noise to the first input voltage ViP, based on a first function of a voltage drop of the internal node A 221 when the comparator 500 is turned on. The kickback voltage added to the ViP is represented as $\Delta Van$ that is equal to a first function of the voltage drop $\Delta Va$. Similarly, because the internal node B 222 is coupled to the second input 124 through the second parasitic capacitor 292, it induces a kickback voltage noise to the second voltage ViN, based on a second function of a voltage drop of the internal node B 222 when the comparator 500 is turned on. The kickback voltage added to the ViN is represented as $\Delta Vbn$ that is equal to a second function of the voltage drop $\Delta Vb$. In one embodiment, both the first function and the second function are a same monotonic function F4, such that: $\Delta Van=F4(\Delta Va)= F4(VDD)$, and $\Delta Vbn=F4(\Delta Vb)=F4(VDD)$. As such, $\Delta Van=\Delta Vbn$. That is, when the comparator 500 is turned on, the two differential inputs ViP and ViN are impacted by an equal kickback noise and dropped by a same amount of voltage ($\Delta Van=\Delta Vbn=F4(VDD)$). As such, a differential operation (ViP−ViN) of the comparator 500 can reduce or cancel out the equal kickback noise. In one example, the comparator 500 in an ADC can improve the SNR of the ADC by about 5 dB based on HSPICE simulation, compared to an existing comparator without the transistor 510 and the transistor 520.

Figure 6:
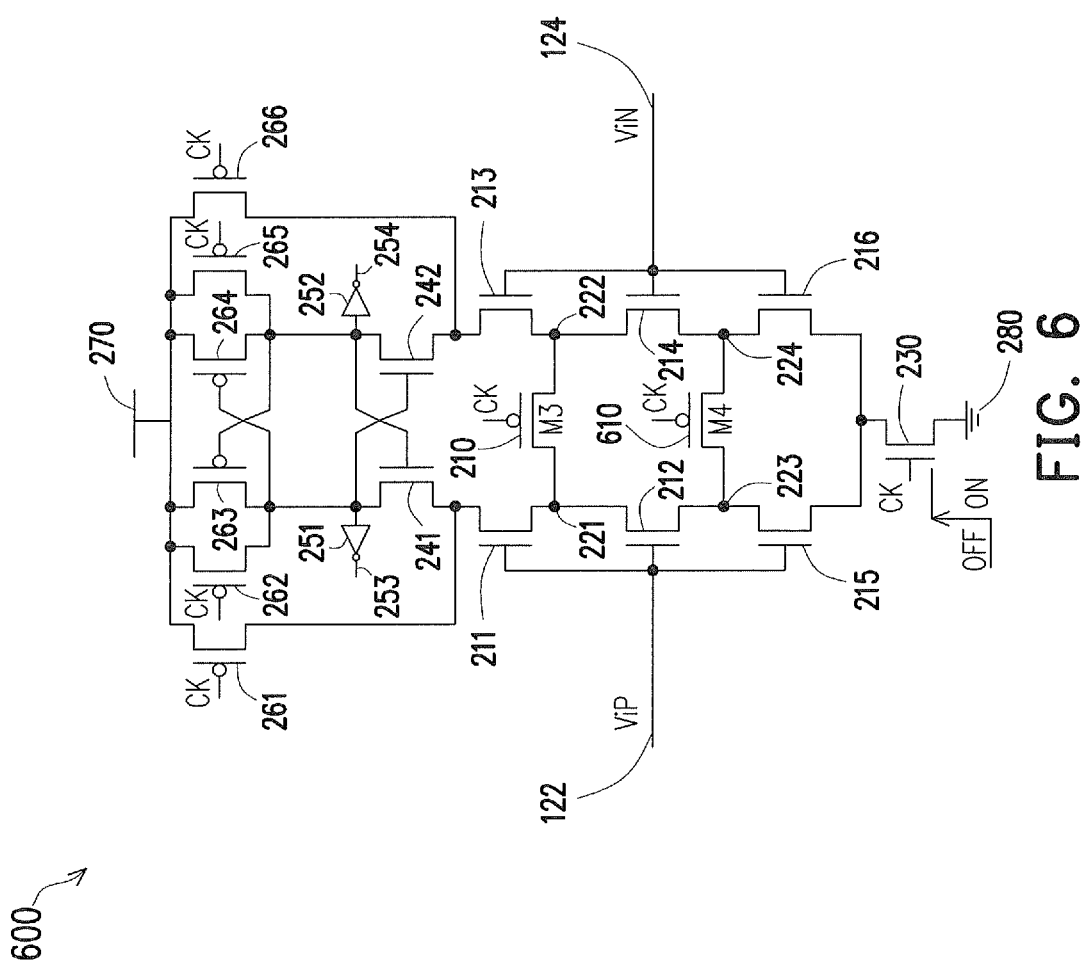
FIG. 6 illustrates a different exemplary circuit of a comparator for reducing kickback noise, in accordance with some embodiments of the present disclosure.

FIG. 6 illustrates a different exemplary circuit 600 of a comparator for reducing kickback noise, in accordance with some embodiments of the present disclosure. The comparator 600 in this example is similar to the comparator 200 in FIG. 2A, except that: each stack-gate transistor group has three transistors cascaded in series, and there is an additional switch M4 610.

As shown in FIG. 6, in addition to the transistors 211 and 212, the first transistor group further comprises a transistor 215. The transistor 212 has a drain coupled to another internal node 223, while the transistor 215 has a source coupled to the internal node 223. Gates of the transistor 211, the transistor 212, and the transistor 215 are coupled together to the first input 122 of the comparator 600. As such, the transistors 211, 212, 215 are cascaded to form an equivalent transistor with a longer gate length that is equal to a sum of the gate lengths of the transistors 211, 212, 215. That is, the transistor 211, responsive to a first differential signal ViP from the first input 122, is configured for conducting current to the node 221; the transistor 212, responsive to the first differential signal, is configured for conducting current from the node 221 to the node 223; and the transistor 215, responsive to the first differential signal, is configured for conducting current from the node 223.

Similarly, as shown in FIG. 6, in addition to the transistors 213 and 214, the second transistor group further comprises a transistor 216. The transistor 214 has a drain coupled to another internal node 224, while the transistor 216 has a source coupled to the internal node 224. Gates of the transistor 213, the transistor 214, and the transistor 216 are coupled together to the second input 124 of the comparator 600. As such, the transistors 213, 214, 216 are cascaded to form an equivalent transistor with a longer gate length that is equal to a sum of the gate lengths of the transistors 213, 214, 216. That is, the transistor 213, responsive to a second differential signal ViN from the second input 124, is configured for conducting current to the node 222; the transistor 214, responsive to the second differential signal, is configured for conducting current from the node 222 to the node 224; and the transistor 216, responsive to the second differential signal, is configured for conducting current from the node 224.

In this embodiment, drains of the transistor 215 and the transistor 216 are coupled together and coupled to the control transistor 230. In other embodiments, each stack-gate transistor group may have four or more transistors cascaded in series. In this embodiment, each of the node 221 and the node 223 is coupled to the first input 122 through a parasitic capacitor, and each of the node 222 and the node 224 is coupled to the second input 124 through a parasitic capacitor.

As shown in FIG. 6, the comparator 600 comprises both the switch M3 210 and a switch M4 610. The switch M3 210 is connected to both the node 221 and the node 222; and the switch M4 610 is connected to both the node 223 and the node 224. In this embodiment, the switch M3 210 comprises a transistor coupled between the node 221 and the node 222; and the switch M4 610 comprises a transistor coupled between the node 223 and the node 224. According to various embodiments, each of the transistors 210, 610 may be: a p-type metal-oxide-semiconductor (PMOS) transistor, an n-type metal-oxide-semiconductor (NMOS) transistor, or a complementary metal-oxide-semiconductor (CMOS) transistor. In one example, the transistor 210 has a source coupled to the node 221, and a drain coupled to the node 222. In another example, the transistor 210 has a drain coupled to the node 221, and a source coupled to the node 222. In one example, the transistor 610 has a source coupled to the node 223, and a drain coupled to the node 224. In another example, the transistor 610 has a drain coupled to the node 223, and a source coupled to the node 224. In any of these examples, each of the transistors 210, 610 has a gate coupled to an inverse of the control signal CK.

The control signal CK can control the comparator 600 to be turned on and off by having a logic high voltage and a logic low voltage, respectively. As shown in FIG. 6, when the comparator 600 operates at an off mode and the control signal CK has a voltage at a logic low level, the control transistor 230 is turned off, such that the drains of the transistor 215 and the transistor 216 are electrically disconnected from the ground 280. In addition, because an inverse of the control signal CK has a voltage at a logic high level, the transistor 261 and the transistor 266 are turned on, such that sources of the transistor 211 and the transistor 213 are electrically connected to the power supply 270. In this case, without the transistor 210 and the transistor 610 in the comparator 600, each of the internal nodes 221, 222, 223, 224 would be floating and could have an arbitrary voltage, e.g. due to an unavoidable process mismatch or an asymmetric layout of the components in the comparator 600. As such, without the transistor 210 and the transistor 610 in the comparator 600, the voltages of the internal nodes 221, 222, 223, 224 cannot be controlled when the comparator 600 operates at an off mode.

With the transistor 210 coupled between the internal node 221 and the internal node 222 as shown in FIG. 6, when the comparator 600 operates at an off mode and the control signal CK has a voltage at a logic low level, an inverse of the control signal CK has a voltage at a logic high level to turn on the transistor 210. As such, the internal node 221 and the internal node 222 are electrically connected to each other to have a same voltage V1, when the comparator 600 operates at the off mode.

Similarly, with the transistor 610 coupled between the internal node 223 and the internal node 224 as shown in FIG. 6, when the comparator 600 operates at an off mode and the control signal CK has a voltage at a logic low level, an inverse of the control signal CK has a voltage at a logic high level to turn on the transistor 610. As such, the internal node 223 and the internal node 224 are electrically connected to each other to have a same voltage V2, when the comparator 600 operates at the off mode.

On the other hand, when the comparator 600 operates at an on mode and the control signal CK has a voltage at a logic high level, the control transistor 230 is turned on, such that the drains of the transistor 215 and the transistor 216 are electrically connected to the ground 280. In addition, because an inverse of the control signal CK has a voltage at a logic low level, the transistor 210 and the transistor 610 are turned off. In this case, when the comparator 600 operates at an on mode, voltages of the internal nodes 221, 222, 223, 224 are pulled down to zero or ground voltage. That is, voltage drops of the internal nodes 221, 222 are the same and equal to $\Delta V1=V1-0$; and voltage drops of the internal nodes 223, 224 are the same and equal to $\Delta V2=V2-0$.

Because the internal nodes 221, 223 are coupled to the first input 122 due to parasitic capacitance, they induce a kickback voltage noise to the first input voltage ViP, based on a first function of voltage drops of the internal nodes 221, 223 when the comparator 600 is turned on. The kickback voltage added to the ViP is represented as $\Delta V1n$ that is equal to a first function of the voltage drops $\Delta V1$ and $\Delta V2$. Similarly, because the internal nodes 222, 224 are coupled to the second input 124 due to parasitic capacitance, they induce a kickback voltage noise to the second input voltage ViN, based on a second function of voltage drops of the internal nodes 222, 224 when the comparator 600 is turned on. The kickback voltage added to the ViN is represented as $\Delta V2n$ that is equal to a second function of the voltage drops $\Delta V1$ and $\Delta V2$. In one embodiment, both the first function and the second function are a same monotonic function F5, such that: $\Delta V1n=F5(\Delta V1, \Delta V2)$, and $\Delta V2n=F5(\Delta V1, \Delta V2)$. As such, $\Delta V1n=\Delta V2n$. That is, when the comparator 600 is turned on, the two differential inputs ViP and ViN are impacted by an equal kickback noise and dropped by a same amount of voltage ($\Delta V1n=\Delta V2n=F5(\Delta V1, \Delta V2)$). As such, a differential operation (ViP−ViN) of the comparator 600 can reduce or cancel out the equal kickback noise.

Figure 7:
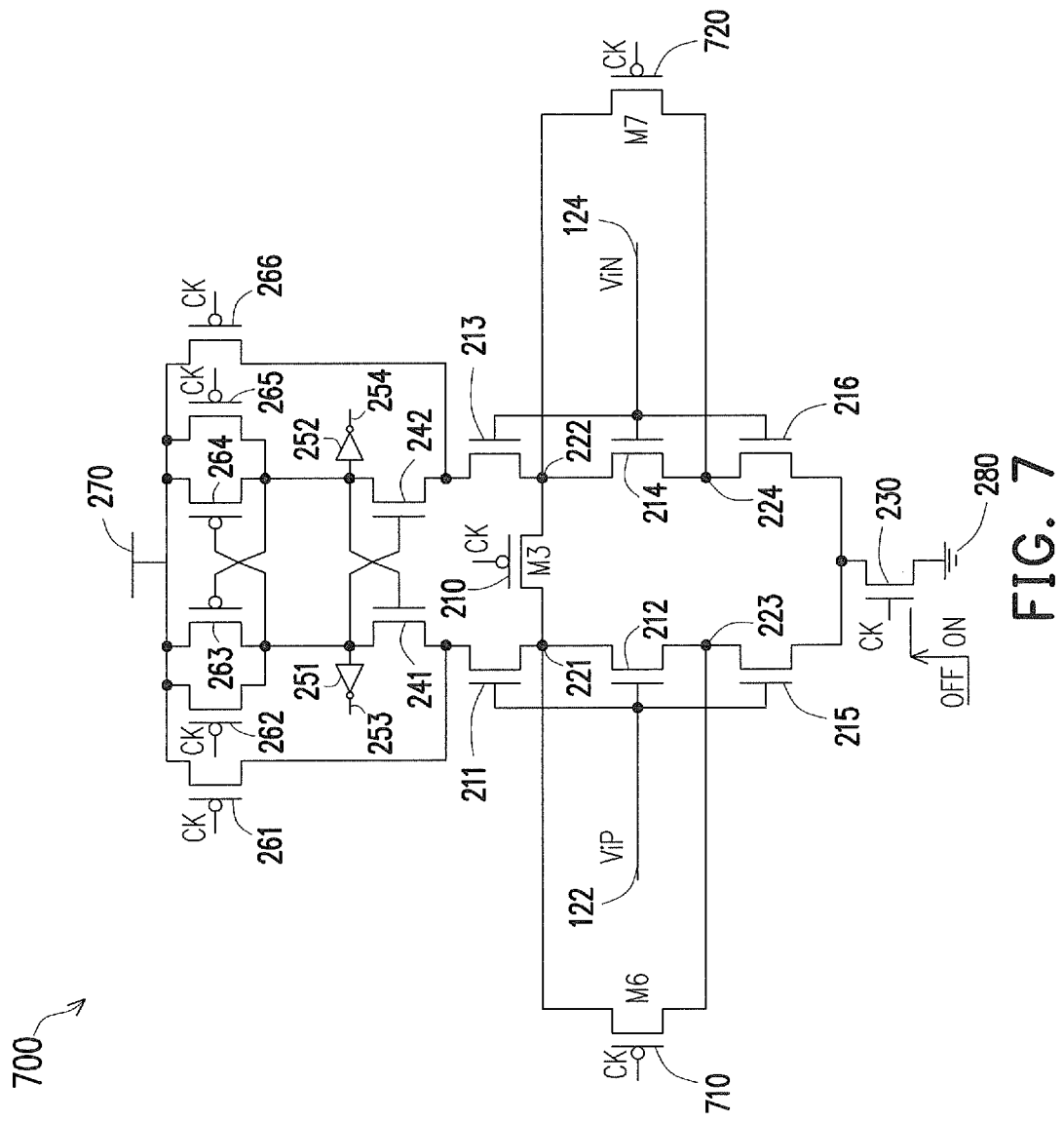
FIG. 7 illustrates another exemplary circuit of a comparator for reducing kickback noise, in accordance with some embodiments of the present disclosure.

FIG. 7 illustrates another exemplary circuit 700 of a comparator for reducing kickback noise, in accordance with some embodiments of the present disclosure. The comparator 700 in this example is similar to the comparator 600 in FIG. 6. But instead of having the transistor 610 as shown in FIG. 6, the comparator 700 in FIG. 7 comprises: a switch M6 710 connected between the node 221 and the node 223, and a switch M7 720 connected between the node 222 and the node 224.

In one embodiment, each of the switch 710 and the switch 720 comprises a transistor which may be: a p-type metal-oxide-semiconductor (PMOS) transistor, an n-type metal-oxide-semiconductor (NMOS) transistor, or a complementary metal-oxide-semiconductor (CMOS) transistor. In one example, the transistor 710 has a source coupled to the node 221 and a drain coupled to the node 223; the transistor 720 has a source coupled to the node 222 and a drain coupled to the node 224. Gates of the transistor 710 and the transistor 720 are coupled to an inverse of the control signal CK.

The control signal CK can control the comparator 700 to be turned on and off by having a logic high voltage and a logic low voltage, respectively. As shown in FIG. 7, when the comparator 700 operates at an off mode and the control signal CK has a voltage at a logic low level, the control transistor 230 is turned off, such that the drains of the transistor 215 and the transistor 216 are electrically disconnected from the ground 280. In addition, because an inverse of the control signal CK has a voltage at a logic high level, the transistor 261 and the transistor 266 are turned on, such that sources of the transistor 211 and the transistor 213 are electrically connected to the power supply 270. In this case, without the transistor 210, the transistor 710 and the transistor 720 in the comparator 700, each of the internal nodes 221, 222, 223, 224 would be floating and could have an arbitrary voltage, e.g. due to an unavoidable process mismatch or an asymmetric layout of the components in the comparator 700. As such, without the transistor 210, the transistor 710 and the transistor 720 in the comparator 700, the voltages of the internal nodes 221, 222, 223, 224 cannot be controlled when the comparator 700 operates at an off mode.

With the transistor 210 coupled between the internal node 221 and the internal node 222 as shown in FIG. 7, when the comparator 700 operates at an off mode and the control signal CK has a voltage at a logic low level, an inverse of the control signal CK has a voltage at a logic high level to turn on the transistor 210. As such, the internal node 221 and the internal node 222 are electrically connected to each other to have a same voltage V, when the comparator 700 operates at the off mode.

With the transistor 710 coupled between the internal node 221 and the node 223 as shown in FIG. 7, when the comparator 700 operates at an off mode and the control signal CK has a voltage at a logic low level, an inverse of the control signal CK has a voltage at a logic high level to turn on the transistor 710. As such, the internal node 223 is electrically connected to the node 221 to also have a voltage V when the comparator 700 operates at the off mode. Similarly, with the transistor 720 coupled between the internal node 222 and the node 224 as shown in FIG. 7, when the comparator 700 operates at an off mode and the control signal CK has a voltage at a logic low level, an inverse of the control signal CK has a voltage at a logic high level to turn on the transistor 720. As such, the internal node 224 is electrically connected to the node 222 to also have a voltage V when the comparator 700 operates at the off mode. That is, when the comparator 700 operates at the off mode, the internal nodes 221, 222, 223, 224 have the same voltage V.

On the other hand, when the comparator 700 operates at an on mode and the control signal CK has a voltage at a logic high level, the control transistor 230 is turned on, such that the drains of the transistor 215 and the transistor 216 are electrically connected to the ground 280. In addition, because an inverse of the control signal CK has a voltage at a logic low level, the transistor 210, the transistor 710 and the transistor 720 are turned off. In this case, when the comparator 700 operates at an on mode, voltages of the internal nodes 221, 222, 223, 224 are pulled down to zero or ground voltage. That is, voltage drops of the internal nodes 221, 222, 223, 224 are all the same and equal to $\Delta V = V - 0$.

Because the internal nodes 221, 223 are coupled to the first input 122 due to parasitic capacitance, they induce a kickback voltage noise to the first input voltage ViP, based on a first function of voltage drops of the internal nodes 221, 223 when the comparator 700 is turned on. The kickback voltage added to the ViP is represented as $\Delta V1n$ that is equal to a first function of the voltage drop $\Delta V$. Similarly, because the internal nodes 222, 224 are coupled to the second input 124 due to parasitic capacitance, they induce a kickback voltage noise to the second input voltage ViN, based on a second function of voltage drops of the internal nodes 222, 224 when the comparator 700 is turned on. The kickback voltage added to the ViN is represented as $\Delta V2n$ that is equal to a second function of the voltage drop $\Delta V$. In one embodiment, both the first function and the second function are a same monotonic function F6, such that: $\Delta V1n = F6(\Delta V)$, and $\Delta V2n = F6(\Delta V)$. As such, $\Delta V1n = \Delta V2n$. That is, when the comparator 700 is turned on, the two differential inputs ViP and ViN are impacted by an equal kickback noise and dropped by a same amount of voltage ($\Delta V1n = \Delta V2n = F6(\Delta V)$). As such, a differential operation (ViP-ViN) of the comparator 700 can reduce or cancel out the equal kickback noise.

Any of the embodiments disclosed in FIG. 2A to FIG. 7 may be combined to form another embodiment. For example, a comparator having a structure similar to any of the comparators 300, 400, 500 may further comprise one or more transistors in each transistor group to have a stack-gate structure with three or more stages. The comparator then has at least one additional pair of internal nodes, in addition to the nodes 221, 222. Each additional pair of internal nodes in the comparator have a same voltage when the comparator is turned off. This may be realized by: an additional switch coupled between the additional pair of internal nodes; two switches that tie the additional pair of internal nodes to the power supply 270; or two switches each of which ties a respective one of the additional pair of internal nodes to a node that is tied to the power supply 270.

Figure 8:
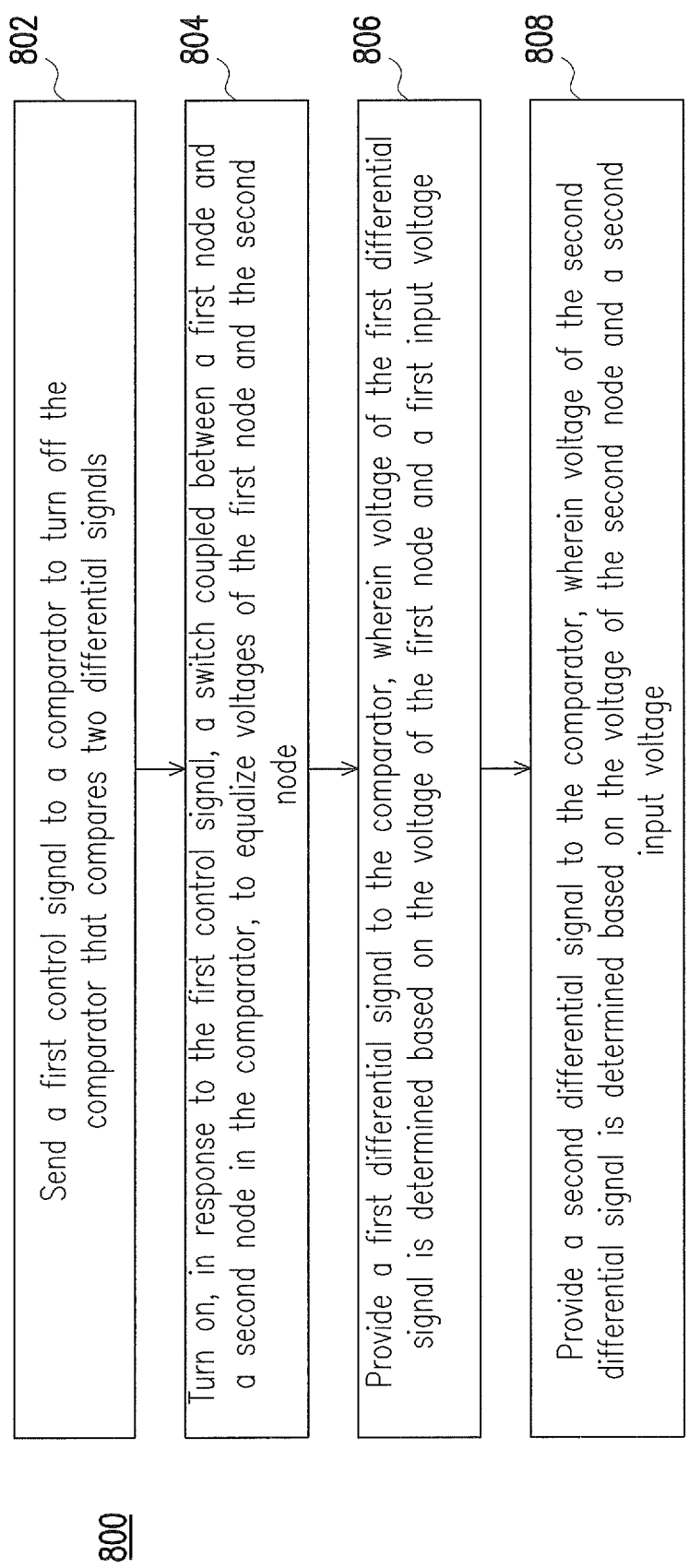
FIG. 8 shows a flow chart illustrating an exemplary method for reducing kickback noise in a comparator, in accordance with some embodiments of the present disclosure.

FIG. 8 shows a flow chart 800 illustrating an exemplary method for reducing kickback noise in a comparator, in accordance with some embodiments of the present disclosure. At operation 802, a first control signal is sent to a comparator to turn off the comparator that compares two differential signals. At operation 804, in response to the first control signal, a first voltage is locked to a first node in the comparator. The first voltage induces a first kickback voltage to a first input of the comparator through a first parasitic capacitor. At operation 806, in response to the first control signal, a second voltage that is same as the first voltage is locked to a second node in the comparator. The second voltage induces a second kickback voltage to a second input of the comparator through a second parasitic capacitor. At operation 808, a third voltage is locked to a first differential signal to be compared. The third voltage is a sum of the first kickback voltage and a first input voltage of the first input. At operation 810, a fourth voltage is locked to a second differential signal to be compared. The fourth voltage is a sum of the second kickback voltage that is same as the first kickback voltage and a second input voltage of the second input. The order of the steps shown in FIG. 8 may be changed according to different embodiments of the present disclosure.

In an embodiment, a circuit for a comparator is disclosed. The circuit includes: a first transistor group, a second transistor group, and a first switch. The first transistor group comprises a first transistor having a drain coupled to a first node, and a second transistor having a source coupled to the first node. Gates of the first transistor and the second transistor are coupled together to a first input of the comparator. The second transistor group comprises a third transistor having a drain coupled to a second node, and a fourth transistor having a source coupled to the second node. Gates of the third transistor and the fourth transistor are coupled together to a second input of the comparator. The first switch is connected to and between the first node and the second node.

In another embodiment, a circuit for a comparator is disclosed. The circuit includes: a first transistor group, a second transistor group, a first switch, and a second switch. The first transistor group comprises a first transistor having a drain coupled to a first node, and a second transistor having a source coupled to the first node. Gates of the first transistor and the second transistor are coupled together to a first input of the comparator. The second transistor group comprises a third transistor having a drain coupled to a second node, and a fourth transistor having a source coupled to the second node. Gates of the third transistor and the fourth transistor are coupled together to a second input of the comparator. The first switch is connected between the first node and a power supply. The second switch is connected between the second node and the power supply.

In yet another embodiment, a method for reducing kickback noise in a comparator that compares two differential signals is disclosed. The method includes: sending a first control signal to the comparator to turn off the comparator; locking, in response to the first control signal, a first voltage to a first node in the comparator, wherein the first voltage induces a first kickback voltage to a first input of the comparator through a first parasitic capacitor; locking, in response to the first control signal, a second voltage to a second node in the comparator, wherein the second voltage induces a second kickback voltage to a second input of the comparator through a second parasitic capacitor; locking a third voltage to a first differential signal to be compared, wherein the third voltage is a sum of the first kickback voltage and a first input voltage of the first input; and locking a fourth voltage to a second differential signal to be compared, wherein the fourth voltage is a sum of the second kickback voltage and a second input voltage of the second input. The first voltage is the same as the second voltage. The first kickback voltage is the same as the second kickback voltage.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for comparing two signals at a first input and a second input of a comparator, comprising:
   a first transistor having a drain coupled to a first node;
   a second transistor having a source coupled to the first node, wherein gates of the first transistor and the second transistor are coupled together to the first input of the comparator;
   a third transistor having a drain coupled to a second node;
   a fourth transistor having a source coupled to the second node, wherein gates of the third transistor and the fourth transistor are coupled together to the second input of the comparator; and
   a first switch that is connected between the first node and the second node.

2. The circuit of claim 1, wherein:
   the first input is coupled to a first capacity array.

3. The circuit of claim 2, wherein:
   the second input is coupled to a second capacity array.

4. The circuit of claim 1, wherein:
   the first switch is turned on in response to a first control signal having a voltage at a logic low level.

5. The circuit of claim 4, wherein:
   the first switch is turned off in response to the first control signal having a voltage at a logic high level.

6. The circuit of claim 5, wherein:
   the first node and the second node are electrically connected to each other through the first switch when the first switch is turned on; and
   the first node and the second node are electrically disconnected from each other when the first switch is turned off.

7. The circuit of claim 6, wherein:
   voltages of the first node and the second node are equal to each other when the first switch is turned on.

8. The circuit of claim 1, further comprising:
   a control transistor having a source coupled to both drains of the second transistor and the fourth transistor.

9. The circuit of claim 1, further comprising:
   a latch coupled to sources of the first transistor and the third transistor, wherein:
   the latch comprises:
      a pair of transistors; and
      a pair of inverters each output of which is coupled to a differential output of the comparator.

10. The circuit of claim 1, wherein the first switch comprises at least one of: a p-type metal-oxide-semiconductor (PMOS) transistor, an n-type metal-oxide-semiconductor (NMOS) transistor, and a complementary metal-oxide-semiconductor (CMOS) transistor.

11. The circuit of claim 1, further comprising:
    a fifth transistor having a source coupled to a drain of the second transistor through a third node; and
    a sixth transistor having a source coupled to a drain of the fourth transistor through a fourth node.

12. The circuit of claim 11, further comprising:
    a second switch that is connected to and between the third node and the fourth node.

13. The circuit of claim 11, further comprising:
    a third switch that is connected to and between the first node and the third node; and
    a fourth switch that is connected to and between the second node and the fourth node.

14. A circuit for comparing two signals at a first input and a second input of a comparator, comprising:
    a first transistor having a drain coupled to a first node;
    a second transistor having a source coupled to the first node, wherein gates of the first transistor and the second transistor are coupled together to the first input of the comparator;
    a third transistor having a drain coupled to a second node;
    a fourth transistor having a source coupled to the second node, wherein gates of the third transistor and the fourth transistor are coupled together to the second input of the comparator;
    a fifth transistor having a source coupled to a drain of the second transistor through a third node;
    a first switch that is connected between the first node and a power supply; and
    a second switch that is connected between the second node and the power supply.

15. The circuit of claim 14, wherein:
    the first switch, when turned on, directly couples the first node to the power supply; and
    the second switch, when turned on, directly couples the second node to the power supply.

16. The circuit of claim 14, further comprising:
    a third node that is coupled to the first node through the first switch.

17. The circuit of claim 16, further comprising: a fourth node that is coupled to the second node through the second switch.

18. The circuit of claim 14, wherein:
    the third node and the fourth node are electrically connected to each other when the comparator is turned off; and
    the third node and the fourth node are electrically disconnected from each other when the comparator is turned on.

19. A circuit for comparing two signals at a first input and a second input of a comparator, comprising:
    a first transistor having a drain coupled to a first node;
    a second transistor having a source coupled to the first node, wherein gates of the first transistor and the second transistor are coupled together to the first input of the comparator;
    a third transistor having a drain coupled to a second node;
    a fourth transistor having a source coupled to the second node, wherein gates of the third transistor and the fourth transistor are coupled together to the second input of the comparator;
    a fifth transistor having a source coupled to a drain of the second transistor through a third node;
    a sixth transistor having a source coupled to a drain of the fourth transistor through a fourth node; and
    a first switch that is connected between the first node and a power supply.

20. The circuit of claim 19, further comprising:
a third node that is coupled to the first node through the first switch, wherein:
- the third node and the fourth node are electrically connected to each other when the comparator is turned off, and
- the third node and the fourth node are electrically disconnected from each other when the comparator is turned on.

* * * * *